United States Patent
Tan et al.

[11] Patent Number: 6,013,541
[45] Date of Patent: Jan. 11, 2000

[54] METHOD AND APPARATUS FOR REDUCING WARPAGE IN SEMICONDUCTOR PACKAGES

[75] Inventors: Kok Ping Tan; Siew Kong Wong, both of Singapore, Singapore

[73] Assignee: Advanced Systems Automation Limited, Singapore

[21] Appl. No.: 08/878,652

[22] Filed: Jun. 19, 1997

[30] Foreign Application Priority Data

Jun. 20, 1996 [SG] Singapore ............................... 9610110

[51] Int. Cl.$^7$ ..................................................... H01L 21/44
[52] U.S. Cl. .......................................... 438/106; 438/127
[58] Field of Search .................... 438/106, 117, 438/124, 125, 126, 127

[56] References Cited

U.S. PATENT DOCUMENTS

| | | | |
|---|---|---|---|
| 5,492,866 | 2/1996 | Nishikawa | 438/112 |
| 5,641,997 | 6/1997 | Ohta et al. | 257/788 |
| 5,653,020 | 8/1997 | Romano' et al. | 438/106 |
| 5,825,623 | 10/1998 | Lee et al. | 438/122 |

*Primary Examiner*—Kevin M. Picardat
*Attorney, Agent, or Firm*—Lawrence Y. D. Ho; David D. Chung; Jacqueline C. T. Lui

[57] ABSTRACT

An apparatus and method for reducing warpage in semiconductor packages, and in particular, thin quad flat packages (TQFPs). The apparatus includes a clamping jig having a bottom plate and an upper plate. The bottom plate is connected to a heater which heats the plate to approximately 50 to 70 degrees Celsius. An air supply controller delivers air supply to the upper plate. The TQFPs are placed in between the bottom plate and the upper plate immediately after they have been encapsulated with resin and the resin has cured. The clamping jig clamps the TQFPs in between the bottom and upper plate with a slight force. The TQFPs remain in the clamping jig until they have sufficiently cooled.

14 Claims, 5 Drawing Sheets

METHOD AND APPARATUS FOR REDUCING WARPAGE IN SEMICONDUCTOR PACKAGES

FIELD OF THE INVENTION

The present invention relates to the field of semiconductor packaging, and in particular to a method and apparatus for reducing warpage in semiconductor packages during the encapsulation process.

BACKGROUND OF THE INVENTION

Warpage is a condition where a U-shaped (or upside down U) bend is formed in a semiconductor package during the cooling down period immediately after a semiconductor package has been encapsulated with resin and been cured. Although this problem can occur with all types of semiconductor packages, it is most severe with the thinner packages such as thin quad flat packages (TQFP) used commonly in smart cards or in other applications where thinness is a high priority. Although the warpage may create functional problems of various kind, the most noticeable one is the misalignment of the leads caused by the shift in the angle at which the leads protrude out from the package. This misalignment can prevent the TQFP from mating properly with sockets or circuit boards.

FIG. 1 is an illustration of a TQFP with a warpage problem. The severity of the warpage is commonly quantified by measuring the distance marked "W" in FIG. 1. Currently in the industry, it is common to require a warpage specification of less than 50 microns. The industry so far has faced extreme difficulties in finding a high-yield process for producing packages which meet the required specification. By some estimates, the yield may be as low 20 to 30 percent, which is considered very low by the general semiconductor packaging standards. Hence it is not uncommon to find batches where a relatively large number of TQFP packages have warpage value of 70 to 90 microns. In light of this problem and the industry's failure to solve it, some industry users of TQFPs are forced to accept packages with warpage greater than 50 microns.

In an attempt to rectify the warpage problem, a number of solutions have been proposed and implemented, but without total success. One solution was to place the TQFP in a clamping device, as shown in FIG. 2, during the cooling period of the TQFP immediately after the resin has been cured. The clamping device has an upper plate 5 and bottom plate 7 both having a flat planar surface which makes contact with the TQFP 8. In an attempt to prevent the warpage from forming, a relatively small force (e.g., 400 N or 0.015 N/mm$^2$) is exerted onto the upper plate before the warpage has had time to form. The clamp is left in the clamped position until the package has sufficiently cooled to near room temperature.

Some of the semiconductor packing tools currently available are equipped with this clamping device in the cooling station of the packaging process. This clamp has helped to reduce the severity of the warpage to some degree, but still not enough to significantly increase the yield to acceptable level. Hence, many packages are still above the required specification of 50 microns and so there still exists much room for improvement.

To enhance the effect of the clamping process, it was proposed that the TQFP be placed in a negative clamp, such as the one shown in FIG. 3, during the cooling period. The TQFP 30 in FIG. 3 is a package which has the tendency to warp downward, i.e., warpage having the shape that of an upside down "U". To additionally compensate for this type of warpage, a cavity 35 is provided, in this case, on the bottom plate 40. Again relatively small force is applied on the upper plate 45 until the package bends slightly away from the direction of the warpage in attempt to compensate for the package's tendency to warp in the opposite direction. The package is then left to cool to near room temperature.

Like its predecessor, the negative clamping also did not provide completely satisfactory results as many TQFPs still experienced warpage problems beyond the required specification. Moreover, because of the possibility of damaging the packages due to possible over-compensation, the negative clamping is not accepted as a feasible solution and hence is not implemented.

At least a few other attempts have been made to solve the warpage problem. But to the best of the inventor's knowledge, currently, there exists no effective method and apparatus for eliminating or even significantly reducing the warpage in TQFPs, and certainly no effective method exists to which is simple to use and implement. In light of the seriousness of the warpage problem, and the industry's inability to come up with a simple and effective solution, there is clearly a need to have a method and apparatus for significantly reducing the warpage in semiconductor packages, and particularly, in TQFPs.

OBJECT OF THE INVENTION

It is therefore, the object of the present invention to overcome the shortcomings stated above, and to provide a simple method and apparatus for significantly reducing the warpage problem in semiconductor packages, and particularly, in TQFPs.

SUMMARY OF THE INVENTION

The present invention reduces warpage in semiconductor packages, and in particular, thin quad flat packages (TQFPs). The apparatus includes a clamping jig having a bottom plate and an upper plate. The bottom plate is connected to a heater controller which heats the plate to approximately 50 to 70 degrees Celsius. An air supply controller delivers air to the upper plate. The TQFPs are placed in between the bottom plate and the upper plate immediately after they have been encapsulated with resin and the resin has cured. The clamping jig clamps the TQFPs in between the bottom and upper plate and applies slight force. The TQFPs remain in the clamping jig until the TQFPs have sufficiently cooled.

DETAILED DESCRIPTION OF THE INVENTION

Figure 1:
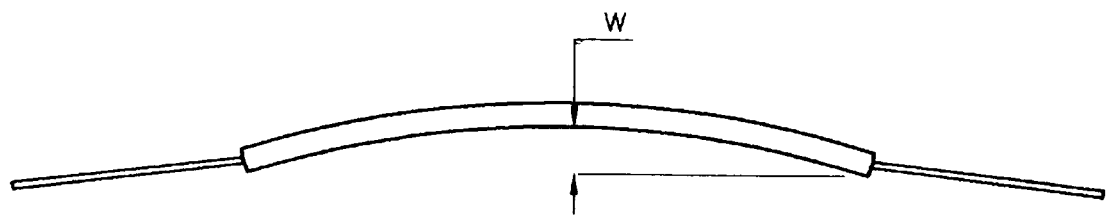
FIG. 1 is a side view of a TQFP having an upside-down U-shaped warpage.
Figure 2:
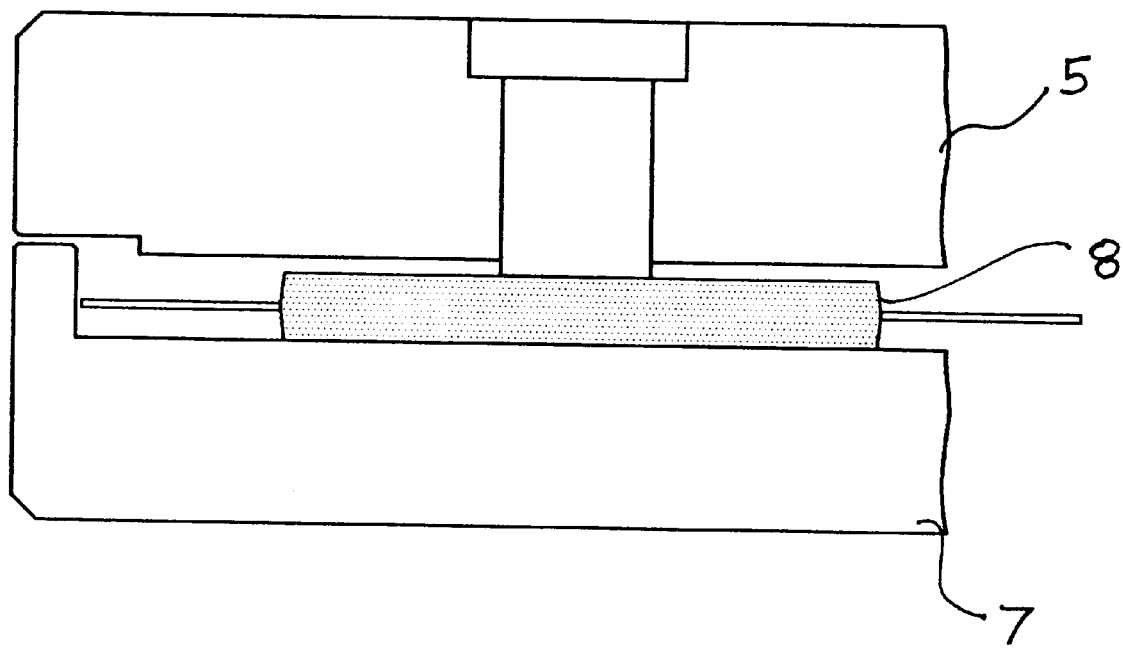
FIG. 2 (prior art) is a side view of a TQFP clamped in a prior art clamping device for reducing warpage in TQFPs.
Figure 3:
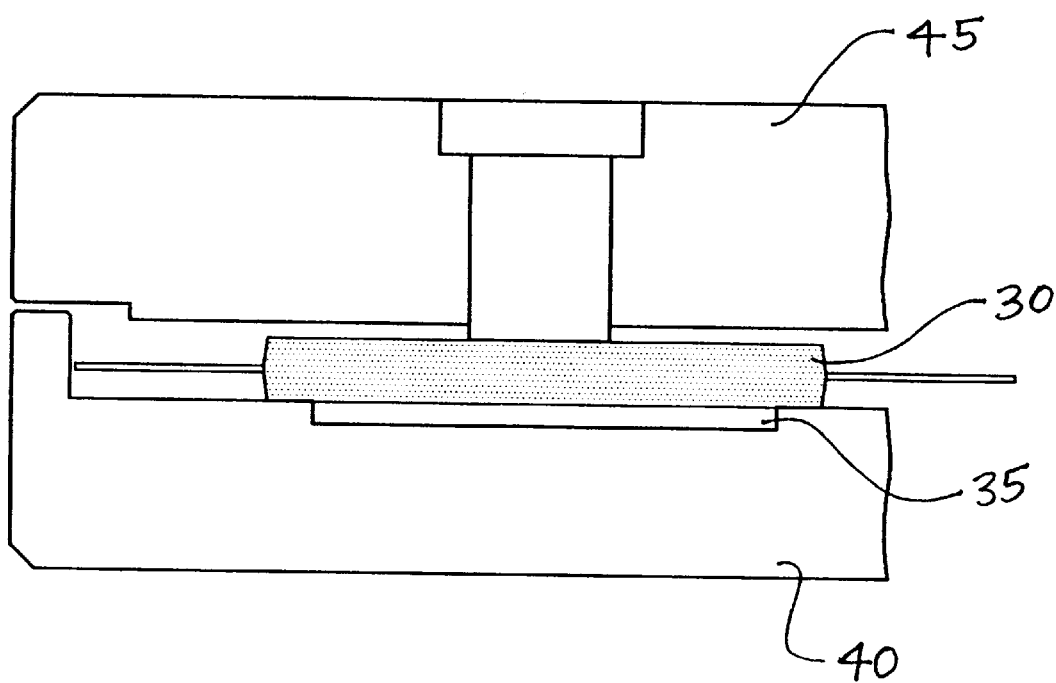
FIG. 3 (prior art) is a side view of a TQFP clamped in a prior art negative clamping device for reducing warpage in TQFPs.
Figure 4:
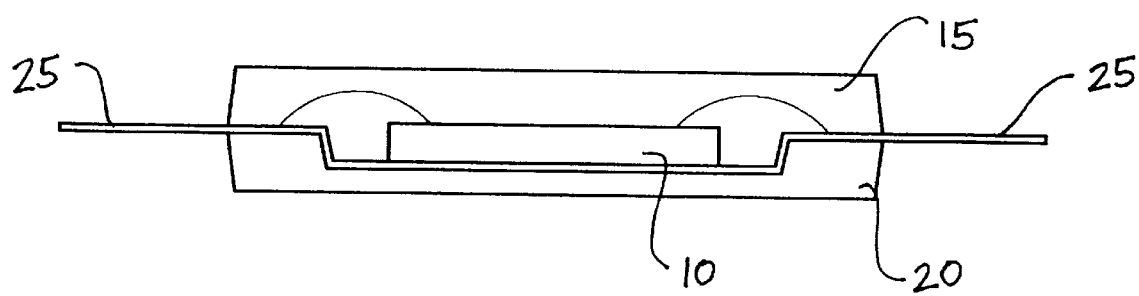
FIG. 4 is a sectional side view of a TQFP.

As illustrated in FIG. 4, an electronic circuit 10 is encapsulated in a semiconductor package with the leads 25 protruding out from the package. It is common practice in the industry to encapsulate the circuit by placing it in a mould where a liquefied resin is extruded into the mould to encapsulate the circuit and the resin is left to cure. The process is conducted in an elevated temperatures to ensure that the resin is properly liquefied. Hence, even after the package has cured, some of the heat is still retained in the resin package, and so the package must be left to cool to near room temperature. It is at this stage that the warpage starts to show. It is commonly understood in the industry that the various factors contribute to the cause of the warpage problem, including die and die pad size ratio; difference in coefficient of thermal expansion of the die; and type of die-attach epoxy and the leadframe, among others. Another possible cause, and the cause most related to the present invention, is the disparity in the cooling rates of the two halves of the semiconductor package. It is believed that the difference in the cooling rates between the top half 15 and the bottom half 20 of the package may be caused by the differential in their respective volume of resin. Where the top cools faster, the warpage is of a shape of a "U"; where the bottom cools faster, the shape is that of an upside-down "U".

Figure 5:
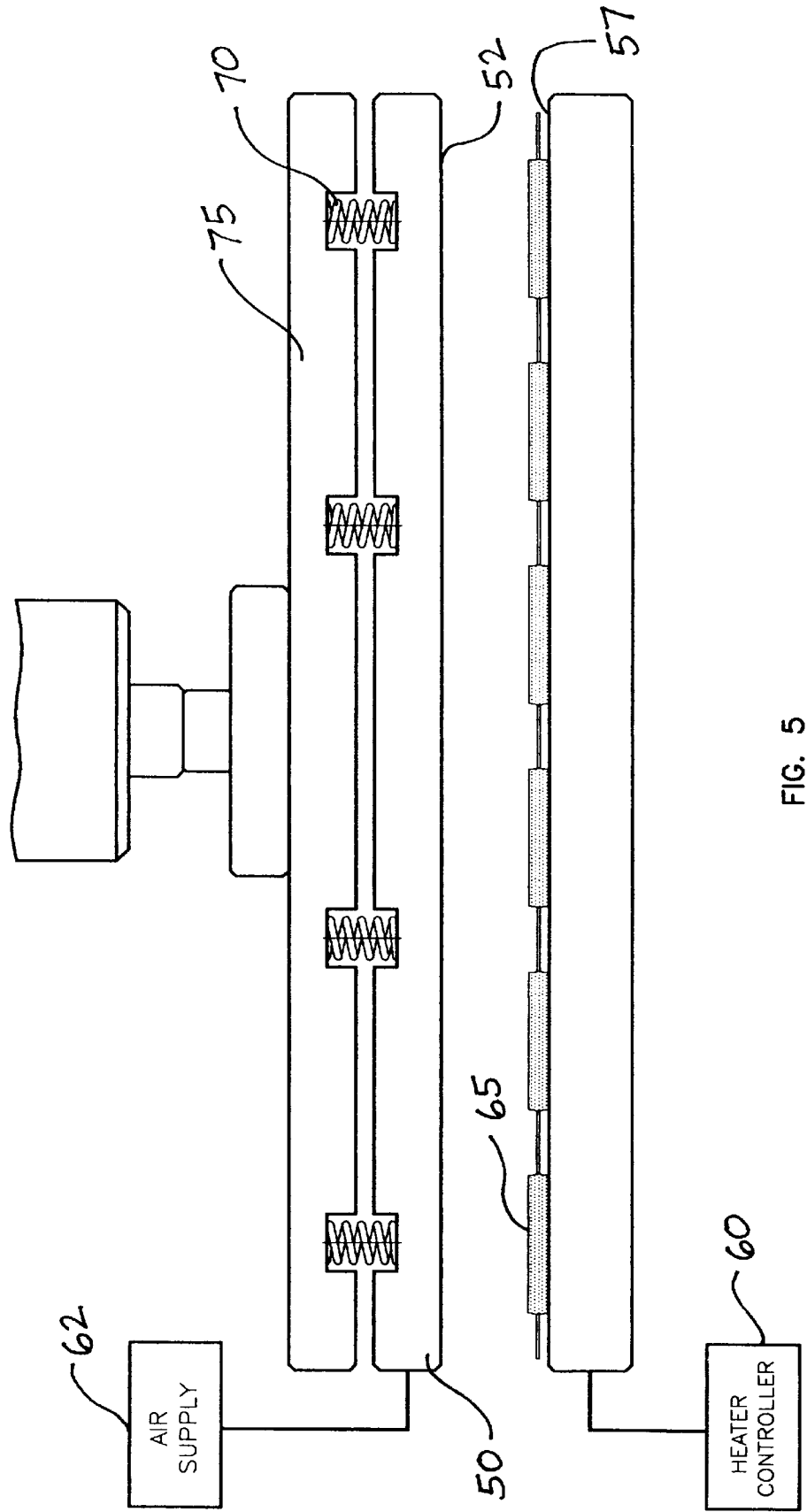
FIG. 5 is a side view of the preferred embodiment of the present invention.

It was recognized by the inventors of the present invention that although the clamping operation as described in the Background section helps to physically resist the TQFP from bending and hence limits the level of warpage to some degree, it does not address the source of the problem, that is the differential in the different cooling rates of the top and bottom half of the package. FIG. 5 illustrates the present invention which addresses the source of this problem to significantly reduce the warpage. The present invention includes a clamping jig which is similar to the clamping device described in the Background portion. As shown in FIG. 5, the clamping jig includes a upper plate 50 and a bottom plate 55. Both the upper plate 50 and the bottom plate 55 have a smooth flat planar surface 52 and 57, respectively, which are long enough to accommodate a lead frame carrying several TQFPs. The preferred embodiment also includes several springs disposed between the upper plate 50 and the base 75 to better control the relatively small amount of force placed on the packages and therefore to avoid any damage to the package. However, the spring mechanism may be eliminated without unduly affecting the warpage-reducing potential of the present invention.

When the TQFP which has been freshly packaged with resin and cured, the temperature of the package can be as high as 120 Celsius. Before this invention, the packages were left to cool in a clamping device until the entire package reached near room temperature. However, the top and bottom halves of the package did not necessarily reach room temperature at the same rate, and it is believed that this difference, at least in part, caused the warpage problem. To facilitate a more even cooling of both the top and bottom halves of a TQFP, the present invention incorporates a heater controller 60 to controllably deliver heat to the bottom plate 55. Air is supplied to the upper plate 50 by an air supply controller 62 to prevent the upper plate from being excessively heated by the heat from the bottom plate and to facilitate a faster cooling of the top half 15.

Various temperatures ranges are possible for the bottom plate, but the temperature should be somewhere between the temperature of the package soon after being encapsulated and the ambient temperature. Although not every temperature range has been tested, experiments have shown that a temperature range of approximately 50 to 70 degrees Celsius resulted in a significant improvement in reducing the warpage. Before the incorporation of the heating element, a typical batch had 50% to 80% of the packages having warpage value of 70 to 90 microns. After incorporating the heating element and maintaining a relatively constant temperature in the range of 50 to 70 degrees Celsius in the bottom plate, a typical batch had over 80% of the packages having a warpage value of 35 to 40 microns.

Although the temperature range of 50 to 70 degrees Celsius has been effective for the present invention, it is believed that other temperature ranges will also yield a significant improvement. In addition, depending on the particular factors involved, the effective temperature range may be different depending on, among others, type of encapsulating machine being used, temperature of the package soon after being encapsulated, type of package, etc.

To obtain the optimal range, one skilled in the art needs to cool a number of batches of TQFPs at different temperature ranges. Each of the TQFPs in the batches should be measured for warpage, and the value should be carefully recorded. Then the batches can be compared using one of several methods. One possible method is to count the number of packages meeting the required specification (whatever required by the customer), and select the temperature range giving the highest yield for a particular batch. Another possible method is to take the average warpage value and select the temperature range giving the lowest warpage value for a particular batch. Other methods of comparison are also possible and may be desirable depending on the needs and desires of the users.

Although in the preferred embodiment, the heating element was attached to the bottom plate, one of ordinary skilled in the art should understand that there may be situations where the heating element will be attached to the upper plate or both plates. For instance, where the cooling rate of the top half of the semiconductor package is greater than the bottom half (which typically would result in a U-shaped warpage) the heating element may need to be connected to the upper plate rather than the bottom plate. In other instances, where the user desires to control the cooling rate of both the bottom and top halves of the package, it would be possible to attach the heater to both the bottom and upper plates of the clamping jig, but supplying different levels of heat to each. Furthermore, there may be situations where variable heat would be preferred over a constant heat level. Hence, various modifications, additions and substitutions are possible for the invention described herein, without departing from the scope and spirit of the invention as disclosed in the accompanying claims.

We claim:

1. A method of reducing an upside down U-shaped warpage in TQFPs using a clamping device having a bottom plate, upper plate, and a heater controller connected to said bottom plate, and an air supply controller connected to said upper plate, said method comprising:

heating said bottom plate of the clamping device to a temperature in a range of about 50 to 70 degrees Celsius;

delivering air supply to said upper plate;

placing the TQFPs in between said bottom plate and said upper plate soon after the TQFPs have been encapsulated;

clamping the TQFPs in between said bottom plate and upper plate; and removing the TQFPs when they have sufficiently cooled.

2. A method of determining an optimal temperature range for an apparatus for reducing warpage in semiconductor packages, said apparatus comprising a clamping device having a bottom plate and an upper plate, said bottom plate and upper plate having a substantially planar surface, a heater controller connected to a plate to controllably provide heat, and an air supply controller for delivering air to a plate not connected to said heater controller, said method comprising:

a) heating a plate to a temperature in a pre-selected temperature range;

b) delivering air to a plate not being heated;

c) placing a batch of semiconductor packages in between said bottom plate and upper plate immediately after said semiconductor packages are encapsulated;

d) clamping said semiconductor packages until said packages are sufficiently cooled;

e) removing said semiconductor packages from said clamping device;

f) measuring a warpage value of each of said semiconductor packages in said batch;

g) choosing a temperature from a different temperature range and repeating steps a) through f);

h) comparing warpage values of a batch with warpage values from other batches; and i) selecting a temperature range corresponding to a batch yielding a lowest level of warpage.

3. A method of reducing warpage in semiconductor packages comprising:

heating at least one plate in a clamping device having a bottom plate and an upper plate such that a temperature difference is created between said bottom plate and said upper plate, said bottom plate and upper plate having a substantially planar surface,;

placing the semiconductor package soon after it has been encapsulated in between said bottom plate and said upper plate;

clamping said semiconductor package in between said bottom plate and upper plate; and removing the semiconductor package when it has sufficiently cooled.

4. The method as recited in claim 3 wherein the semiconductor package warps towards the bottom plate.

5. The method as recited in claim 4 wherein the heating step is performed on only the bottom plate.

6. The method as recited in claim 5 further comprising delivering air supply to the top plate.

7. The method as recited in claim 5 wherein said bottom plate is heated to a temperature between 25 to 120 degrees Celsius.

8. The method as recited in claim 7 wherein said bottom plate is heated to a temperature in a range of about 50 to 70 degrees Celsius.

9. The method as recited in claim 3 wherein said semiconductor package is a TQFP.

10. An apparatus for reducing warpage in semiconductor package comprising:

a clamping device having a bottom plate and an upper plate, said bottom plate and upper plate having a substantially planar surface;

a heater controller connected to said clamping device to controllably provide heat to at least one of said plates to create a temperature difference between said bottom plate and upper plate, whereby the semiconductor package is clamped in between said bottom and upper plate immediately after being encapsulated, said semiconductor package remaining in between said bottom and upper plate until said semiconductor package has sufficiently cooled.

11. The apparatus recited in claim 10 further comprising air supply controller for controllably delivering air to a plate not connected to a heater controller.

12. The apparatus recited in claim 11 wherein said semiconductor package is a TQFP which warps towards the bottom plate.

13. The apparatus recited in claim 11 wherein said heater controller is connected to said bottom plate.

14. The apparatus recited in claim 13 wherein said heater controller heats the bottom plate to a temperature in between a range of about 50 to 70 degrees Celsius.

\* \* \* \* \*